United States Patent

Ogino

(10) Patent No.: US 9,540,724 B2
(45) Date of Patent: *Jan. 10, 2017

(54) SPUTTERING TARGET FOR MAGNETIC RECORDING FILM

(71) Applicant: JX Nippon Mining & Metals Corporation, Tokyo (JP)

(72) Inventor: Shini-ichi Ogino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/372,236

(22) PCT Filed: May 22, 2013

(86) PCT No.: PCT/JP2013/064242
§ 371 (c)(1),
(2) Date: Jul. 15, 2014

(87) PCT Pub. No.: WO2013/190943
PCT Pub. Date: Dec. 27, 2013

(65) Prior Publication Data
US 2014/0346039 A1    Nov. 27, 2014

(30) Foreign Application Priority Data

Jun. 18, 2012 (JP) ................. 2012-136958

(51) Int. Cl.
*C23C 14/16* (2006.01)
*C23C 14/34* (2006.01)
(Continued)

(52) U.S. Cl.
CPC ............... *C23C 14/165* (2013.01); *C22C 5/04* (2013.01); *C22C 30/00* (2013.01);
(Continued)

(58) Field of Classification Search
CPC ............... C23C 14/3414; H01J 37/3429; H01J 37/3426; C22C 5/04; C22C 38/12; C22C 38/10; C22C 19/007; C22C 19/03; C22C 19/07; C22C 27/06; C22C 32/0026; C22C 38/002; C22C 38/02; C22C 38/06
See application file for complete search history.

(56) References Cited

U.S. PATENT DOCUMENTS 7,241,520 B2   7/2007 Shin et al.
7,311,874 B2  12/2007 Zhang
(Continued)

FOREIGN PATENT DOCUMENTS

JP    H06-267063 A    9/1994
JP    2000-268357 A   9/2000
(Continued)

OTHER PUBLICATIONS

Machine Translation JP2012102387.*

*Primary Examiner* — Michael Band
(74) *Attorney, Agent, or Firm* — Howson & Howson, LLP

(57) ABSTRACT

Provided is a sputtering target for a magnetic recording film. The sputtering target has a peak intensity ratio ($I_G/I_D$) of a G-band to a D-band of 5.0 or more in Raman scattering spectrometry. It is an object of the present invention to produce a magnetic thin film having a granular structure without using a high cost co-sputtering apparatus and to provide a sputtering target, in particular, an Fe—Pt-based sputtering target for a magnetic recording film, where carbon particles are dispersed in the target. Since carbon is a material which is not susceptible to being sintered and is susceptible to form aggregates, a conventional carbon-containing sputtering target has the problem that detachment of carbon lumps occurs during sputtering to result in generation of a large number of particles on the film. The present (Continued)

invention also addresses the problem of providing a high density sputtering target that can overcome the disadvantages.

9 Claims, 7 Drawing Sheets

(51) Int. Cl.
  *H01J 37/34* (2006.01)
  *H01F 41/18* (2006.01)
  *C22C 5/04* (2006.01)
  *C22C 38/00* (2006.01)
  *C22C 33/02* (2006.01)
  *C22C 32/00* (2006.01)
  *C22C 30/00* (2006.01)
  *G11B 5/64* (2006.01)
  *G11B 5/851* (2006.01)
  *G11B 5/65* (2006.01)

(52) U.S. Cl.
  CPC .......... *C22C 32/0084* (2013.01); *C22C 33/02* (2013.01); *C22C 33/0278* (2013.01); *C22C 38/00* (2013.01); *C22C 38/002* (2013.01); *C23C 14/3414* (2013.01); *H01F 41/183* (2013.01); *H01J 37/3426* (2013.01); *H01J 37/3429* (2013.01); *C22C 2202/02* (2013.01); *G11B 5/64* (2013.01); *G11B 5/653* (2013.01); *G11B 5/851* (2013.01)

(56) References Cited

U.S. PATENT DOCUMENTS

| | | | |
|---|---|---|---|
| 7,638,020 B2 | 12/2009 | Honda | |
| 7,909,949 B2 | 3/2011 | Nakamura et al. | |
| 7,927,434 B2 | 4/2011 | Nakamura et al. | |
| 2006/0093868 A1 | 5/2006 | Honda | |
| 2007/0172706 A1* | 7/2007 | Chen | C23C 14/06 428/832 |
| 2007/0189916 A1 | 8/2007 | Zhang | |
| 2008/0057350 A1 | 3/2008 | Das et al. | |
| 2009/0139859 A1 | 6/2009 | Takami et al. | |
| 2010/0320084 A1 | 12/2010 | Sato | |
| 2011/0048935 A1 | 3/2011 | Koide | |
| 2011/0162971 A1 | 7/2011 | Nakamura et al. | |
| 2011/0247930 A1 | 10/2011 | Sato | |
| 2011/0284373 A1 | 11/2011 | Sato et al. | |
| 2012/0097535 A1 | 4/2012 | Ogino et al. | |
| 2012/0118734 A1 | 5/2012 | Sato et al. | |
| 2012/0241316 A1 | 9/2012 | Arakawa | |
| 2012/0273347 A1 | 11/2012 | Koide | |
| 2013/0001079 A1 | 1/2013 | Sato | |
| 2013/0015061 A1 | 1/2013 | Sato | |
| 2013/0034747 A1 | 2/2013 | Taniguchi | |
| 2013/0098760 A1* | 4/2013 | Takami et al. | 204/298.13 |
| 2013/0112555 A1 | 5/2013 | Ogino et al. | |
| 2013/0134038 A1 | 5/2013 | Sato et al. | |
| 2013/0168240 A1* | 7/2013 | Ogino et al. | 204/298.13 |
| 2013/0175167 A1 | 7/2013 | Ikeda et al. | |
| 2013/0206591 A1 | 8/2013 | Takami et al. | |
| 2013/0206592 A1 | 8/2013 | Arakawa et al. | |
| 2013/0206593 A1 | 8/2013 | Arakawa et al. | |
| 2013/0213802 A1 | 8/2013 | Sato et al. | |
| 2013/0213803 A1* | 8/2013 | Sato | B22F 3/14 204/298.13 |
| 2013/0213804 A1 | 8/2013 | Arakawa et al. | |
| 2013/0220804 A1 | 8/2013 | Arakawa et al. | |
| 2013/0240352 A1* | 9/2013 | Ikeda | 204/298.13 |
| 2013/0306470 A1* | 11/2013 | Ogino et al. | 204/298.13 |
| 2013/0306471 A1* | 11/2013 | Ishiyama | B22F 3/14 204/298.13 |
| 2014/0001038 A1 | 1/2014 | Ogino et al. | |
| 2014/0021043 A1 | 1/2014 | Miyashita et al. | |
| 2014/0083847 A1* | 3/2014 | Sato | 204/298.13 |
| 2014/0231250 A1* | 8/2014 | Ogino et al. | 204/298.13 |
| 2015/0060268 A1* | 3/2015 | Ogino | 204/298.13 |

FOREIGN PATENT DOCUMENTS

| | | | | |
|---|---|---|---|---|
| JP | 2000-306228 A | 11/2000 | | |
| JP | 2000-311329 A | 11/2000 | | |
| JP | 2003-28802 A | 1/2003 | | |
| JP | 2012-102387 A | 5/2012 | | |
| JP | 2012102387 A * | 5/2012 | | |
| JP | WO 2012105201 A1 * | 8/2012 | ............... B22F 3/14 |
| WO | WO 2012029498 A1 * | 3/2012 | | |
| WO | 2012-073879 A1 | 6/2012 | | |
| WO | WO 2012073882 A1 * | 6/2012 | | |
| WO | 2012-133166 A1 | 10/2012 | | |

* cited by examiner

SPUTTERING TARGET FOR MAGNETIC RECORDING FILM

BACKGROUND

The present invention relates to a sputtering target, in particular, a carbon (C) particle-dispersed Fe—Pt-based sputtering target, for producing thermally assisted magnetic recording media.

In the field of magnetic recording represented by hard disk drives, ferromagnetic metal-based materials, i.e., Co, Fe, or Ni-based materials, are used as materials of magnetic thin films in magnetic recording media. For example, in the magnetic thin film of a hard disk employing a longitudinal magnetic recording system, a Co—Cr-based or Co—Cr—Pt-based ferromagnetic alloy mainly composed of Co has been used.

In magnetic thin films of hard disks employing a perpendicular magnetic recording system, which has been recently applied to practical use, composite materials each composed of a Co—Cr—Pt-based ferromagnetic alloy mainly composed of Co and nonmagnetic inorganic particles are widely used. In many cases, the magnetic thin film is produced by sputtering a sputtering target made of the above-mentioned materials with a DC magnetron sputtering apparatus because of its high productivity.

Incidentally, the recording density of a hard disk is rapidly increasing year by year, and it is predicted that the areal recording density will reach 1 Tbit/in$^2$ in the future, whereas the current areal recording density is 600 Gbit/in$^2$. In order to achieve a recording density of 1 Tbit/in$^2$, the recording bit size must be reduced to nm or less. In such a case, occurrence of a problem of superparamagnetization due to thermal fluctuation is predicted. The magnetic recording medium materials currently used, e.g., Co—Cr-based alloys having enhanced crystal magnetic anisotropy by containing Pt therein, are predicted to be insufficient for preventing the problem, and magnetic particles that behave as a stable ferromagnetic material in a size of 10 nm or less need to have higher crystal magnetic anisotropy.

Based on the above-described circumstances, an Fe—Pt phase having a $L1_0$ structure has attracted attention as a material for ultra-high density recording media. The Fe—Pt phase having a $L1_0$ structure has not only high crystal magnetic anisotropy but also excellent corrosion resistance and oxidation resistance and is therefore expected as a material that is suitable to be applied to magnetic recording media.

In order to use the Fe—Pt phase as a material for an ultra-high density recording medium, it is necessary to develop a technology of dispersing Fe—Pt magnetic particles regulated in the same direction with a density as high as possible in a magnetically isolated state.

Accordingly, a magnetic thin film having a granular structure in which Fe—Pt magnetic particles having a $L1_0$ structure are isolated from one another by a nonmagnetic material such as an oxide or carbon has been proposed as a magnetic film for a magnetic recording medium of the next-generation hard disk employing a thermally assisted magnetic recording system.

The granular magnetic thin film has a structure in which the magnetic particles are magnetically isolated from one another by means of the intervention of a nonmagnetic material.

Magnetic recording media including magnetic thin films having a granular structure are described in literatures such as Patent Literatures 1 to 5.

Among the granular magnetic thin films including an Fe—Pt phase having the $L1_0$ structure, a magnetic thin film containing 10% to 50% by volume of carbon as a nonmagnetic material has particularly attracted attention from its high magnetic characteristics. Such a granular magnetic thin film is known to be produced by simultaneously sputtering an Fe target, a Pt target, and a C target or simultaneously sputtering an Fe—Pt alloy target and a C target. In order to simultaneously sputtering these sputtering targets, however, an expensive co-sputtering apparatus is necessary.

In general, sputtering of a sputtering target containing a nonmagnetic material in a form of an alloy with a sputtering apparatus has problems of causing unintended detachment of the nonmagnetic material during the sputtering or generation of particles (dust adhered to a substrate) due to abnormal discharge occurring from holes present in the sputtering target. In order to solve these problems, it is necessary to enhance the adhesion between the nonmagnetic material and the base alloy and to increase the density of the sputtering target. In general, the sputtering target material containing a nonmagnetic material in a form of an alloy is produced by a powder sintering method. However, in the case of an Fe—Pt alloy containing a large amount of C, since C is a material which is not susceptible to be sintered, preparation of a sintered compact having a high density is difficult.

As described above, a Co—Cr—Pt alloy has been widely used as the magnetic phase of a perpendicular magnetic recording layer until now. However, an increase in the recording density needs a reduction of the Co alloy size per bit and also causes a problem of superparamagnetization due to thermal fluctuation. Accordingly, Fe—Pt having a high crystal magnetic anisotropy is attracting attention.

Furthermore, in general, a magnetic recording layer is composed of a magnetic phase of, for example, Fe—Pt and a nonmagnetic phase isolating the magnetic phase, and carbon is known to be effective as a nonmagnetic phase.

However, carbon is a material which C is a material which is not susceptible to be sintered and is susceptible to form aggregates and therefore has problems of readily causing detachment of carbon lumps occurs during sputtering to result in generation of a large number of particles on the film after sputtering.

Accordingly, though improvement of magnetic recording layers has been tried by introducing carbon into a target, the problems in sputtering of the target has not been solved yet.

In addition, formation of a carbon film is proposed. For example, Patent Literature 6 describes:

a magnetic disk including an amorphous hydrogenated carbon layer having one wave peak (A) at a position of 1545 cm$^{-1}$ or less and another wave peak (B) at a position of 1320 to 1360 cm$^{-1}$ and having an area ratio (B/A) of these waves at the half-value widths of the peaks in 0.3 to 0.7, and a method of producing the magnetic disk.

Patent Literature 7 describes a method of evaluating a carbon film including a step of evaluating the film quality of the carbon film based on the ratio $I_D/I_G$ of the intensity $I_D$ of a band D (disorder) having a peak at about 1350 to 1450 cm$^{-1}$ to the intensity $I_G$ of a band G (graphite) having a peak at about 1550 to 1650 cm$^{-1}$ in a surface-enhanced Raman spectrum and a step of confirming whether the $I_D/I_D$ is in the range of 0.1 to 0.5, and a method of producing a magnetic recording medium.

The methods described in Patent Literatures 6 and 7 are, however, merely evaluation of carbon films and do not directly relate to the influence of carbon on a sputtering target when a large amount of carbon is present in the magnetic metal that is a main constituent material of the target for forming a magnetic recording film, the behavior of carbon in the step of producing the target, and the influence on formation of a film by sputtering using the target. Thus, these methods are not technologies in which these influence and behavior are sufficiently revealed.

Patent Literatures 8 and 9 describe evaluation of a SiC- or C-based thin film of a magnetic recording medium by a Raman spectrum and do not directly relate to the influence of carbon on a sputtering target when a large amount of carbon is present in the magnetic metal that is a main constituent material of the target for forming a magnetic recording film, the behavior of carbon in the step of producing the target, and the influence on formation of a film by sputtering using the target. Thus, these methods are not technologies in which these influence and behavior are sufficiently revealed.

CITATION LITERATURE

Patent Literature

Patent Literature 1: Japanese Patent Laid-Open Publication No. 2000-306228
Patent Literature 2: Japanese Patent Laid-Open Publication No. 2000-311329
Patent Literature 3: Japanese Patent Laid-Open Publication No. 2008-59733
Patent Literature 4: Japanese Patent Laid-Open Publication No. 2008-169464
Patent Literature 5: Japanese Patent Laid-Open Publication No. 2004-152471
Patent Literature 6: Japanese Patent Laid-Open Publication No. H06-267063
Patent Literature 7: Japanese Patent Laid-Open Publication No. 2003-028802
Patent Literature 8: Japanese Patent Laid-Open Publication No. 2000-268357
Patent Literature 9: Japanese Patent Laid-Open Publication No. 2006-127621
Patent Literature 10: International Application No. PCT/JP2012/057482

SUMMARY

It is an object of the present invention to produce a magnetic thin film having a granular structure without using an expensive co-sputtering apparatus and to provide a sputtering target, in particular, an Fe—Pt-based sputtering target, for a magnetic recording film, where carbon particles are dispersed in the target. It is another object of the present invention to provide a high-density sputtering target that can solve the problems as these: carbon is a material which is not susceptible to being sintered and is susceptible to form aggregates and thus detachment of carbon lumps occurs during sputtering to result in generation of a large number of particles on the film.

The present inventors have diligently studied for solving the problems and, as a result, have found that aggregation of carbon during pulverization or mixing can be prevented to produce a high density sputtering target in which occurrence of particles is significantly low, that is, the yield of film formation is increased, by improving the material quality of carbon as a nonmagnetic material and uniformly dispersing carbon particles having a predetermined size in a base metal.

The present invention was accomplished based on these findings and provides the following:

1) A sputtering target for a magnetic recording film, wherein the sputtering target contains carbon and has a peak intensity ratio ($I_G/I_D$) of a G-band to a D-band of 5.0 or more in Raman scattering spectrometry;

2) The sputtering target for a magnetic recording film according to 1) above, wherein the sputtering target comprises carbon and a metal component having a composition including 5 mol % or more and 60 mol % or less of Pt and balance of Fe;

3) The sputtering target for a magnetic recording film according to 1) or 2) above, wherein the sputtering target contains 10 mol % or more and 70 mol % or less of carbon;

4) The sputtering target for a magnetic recording film according to any one of 1) to 3) above, wherein the sputtering target has a relative density of 90% or more;

5) The sputtering target for a magnetic recording film according to any one of 1) to 4) above, wherein the sputtering target further comprises 0.5 mol % or more and 20 mol % or less of at least one additional element selected from B, Ru, Ag, Au, and Cu; and 6) The sputtering target for a magnetic recording film according to any one of 1) to 5) above, wherein the sputtering target further comprises 0.5 mol % or more and 20 mol % or less of at least one oxide additive selected from $SiO_2$, $Cr_2O_3$, CoO, $Ta_2O_5$, $B_2O_3$, MgO, and $Co_3O_4$.

The sputtering target for a magnetic recording film of the present invention can produce a magnetic thin film having a granular structure without using a high cost co-sputtering apparatus. The invention can provide a sputtering target, in particular, an Fe—Pt-based sputtering target, for a magnetic recording film, where carbon particles are dispersed in the target and has an excellent effect of solving the problem that carbon is a material which is not susceptible to being sintered and is susceptible to form aggregates and thus detachment of carbon lumps occurs during sputtering to result in generation of a large number of particles on the film.

DETAILED DESCRIPTION

Figure 1:
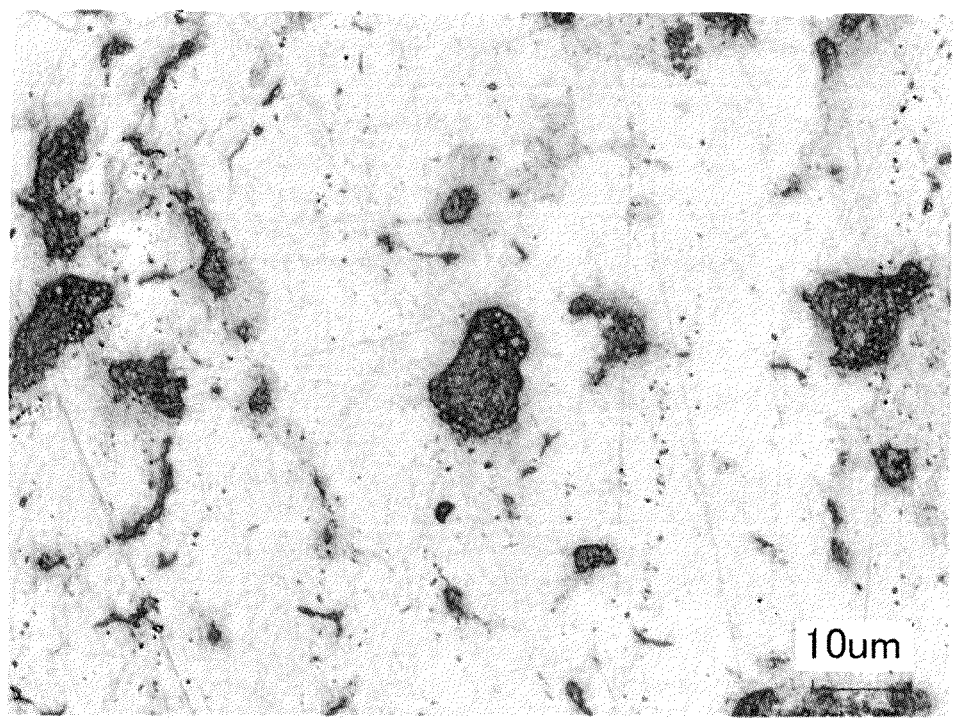
FIG. 1 is a structural image of the sintered compact of Example 1 observed with a laser microscope.

The present inventors have believed before that particles during sputtering can be reduced through an improvement in the sputtering characteristics of a carbon material by intentionally destroying the crystallinity of carbon (Patent Literature 10). However, significantly fine carbon particles aggregate in some cases, and the aggregates cause occurrence of particles during sputtering in some cases.

The inventors have then found that the sinterability of carbon can be enhanced by selecting a carbon material having a size that hardly causes aggregation and uniformly dispersing the carbon material in a base metal (matrix) such that the carbon material is not pulverized during mixing and thereby particles during sputtering can be reduced.

Accordingly, the sputtering target for a magnetic recording film of the present invention contains carbon, and the peak intensity ratio ($I_G/I_D$) of the G-band to the D-band in Raman scattering spectrometry of the sputtering target is 5.0 or more.

Such a case is particularly effective in a sputtering target for a magnetic recording film composed of carbon and a metal component having a composition including 5 mol % or more and 60 mol % or less of Pt and the balance of Fe. The contents of these components are requirements for providing satisfactory magnetic characteristics.

The content of carbon is preferably 10 mol % or more and 70 mol % or less. A content of carbon in a target composition of less than 10 mol % may not provide satisfactory magnetic characteristics, whereas a content of higher than 70 mol % may cause aggregation of carbon particles to increase the occurrence of particles.

The sputtering target for a magnetic recording film can have a relative density of 90% or more. The relative density of 90% or more is one of requirements of the present invention. A high relative density prevents the problem owing to degassing from the sputtering target during the sputtering and enhances the adhesion between an alloy and carbon particles. As a result, occurrence of particles is effectively inhibited. The relative density is more preferably 95% or more.

The relative density in the present invention is a value determined by dividing the measured density of a target by the calculated density (theoretical density). The calculated density is a density when it is assumed that the constituent elements of a target are mixed without diffusing to or reacting with each other and is calculated by the following expression:

Expression: calculated density=Σ[(atomic weight of a constituent element)×(atomic ratio of the constituent element)]/Σ[(atomic weight of the constituent element)×(atomic ratio of the constituent element)/(literature density data of the constituent element)], wherein, Σ means the sum of the values of all constituent elements of the target.

The sputtering target for a magnetic recording film may further contain 0.5 mol % or more and 20 mol % or less of at least one additional element selected from B, Ru, Ag, Au, and Cu. The addition of these elements is optional, and these elements can be added for improving the magnetic characteristics depending on the material.

The sputtering target for a magnetic recording film may contain a ceramic material, such as an oxide or a nitride, as an additive. The sputtering target preferably contains 0.5 mol % or more and 20 mol % or less of at least one oxide selected from $SiO_2$, $Cr_2O_3$, CoO, $Ta_2O_5$, $B_2O_3$, MgO, and $Co_3O_4$. The addition of these additives is optional, and these additives can be added for improving the magnetic characteristics depending on the sputtering target material.

The planar structure of graphite is increased in size with an increase in the primary particle diameter of the carbon material. It is therefore believed that the primary particle diameter correlates closely with crystallinity. Accordingly, the present inventors evaluated the crystallinity of carbon by Raman scattering spectrometry and compared the crystallinity with the amount of particles generated during sputtering to demonstrate a high correlation between them.

As an index for evaluating the crystallinity (completeness) of the $sp^2$ hybrid orbital) of a carbon material, the ratio between a G-band and a D-band in generally known Raman scattering spectrometry can be employed.

The G-band is a vibration mode originated from the six-membered ring structure of graphite and appears as a peak at approximately 1570 $cm^{-1}$. The peak intensity increases with an increase in completeness of the crystalline structure.

The D-band is a vibration mode originated from the defect structure of graphite and appears as a peak at approximately 1350 $cm^{-1}$. The peak intensity increases with an increase of the defect.

That is, a carbon material having higher crystallinity has a higher $I_D/I_G$ ratio. A higher intensity of the G-band means higher completeness (higher crystallinity) of the crystalline structure and a lower intensity means higher incompleteness (lower crystallinity) of the crystalline structure.

As the Raman scattering spectrometer, Renishaw inVia Raman Microscope (produced by Renishaw plc.) was used. As the light source of excitation light, Compass™ 315 M Diode-Pumped Laser (produced by Coherent, Inc.) was used at an excitation wavelength of 532 nm and an output of the excitation light source of 5 mW. The diffraction grating used was 1800 L/mm. The Raman shift in the range of 1033 to 1842 $cm^{-1}$ was measured.

In the curve fitting of the measurement results, a Lorentz function was used. A D'-band also appears at approximately 1620 $cm^{-1}$ and is a vibration mode originated from a defect structure of graphite, but it does not directly relates to the present invention. Accordingly, as a matter of convenience of curve fitting, the D'-band is not used in the curve fitting and is merely shown in the figure.

In the present invention, the vibration modes of G-band and D-band in Raman scattering spectrometry are measured using a laser excitation wavelength of 532 nm. The excitation light source may be a gas laser such as an Ar laser, a He—Ne laser, or a Kr laser. These lasers can be appropriately selected depending on the desired excitation wavelength.

In the Raman spectrum of this case, an intensity $I_G$ of the G-band having a peak at 1520 to 1600 $cm^{-1}$ and an intensity ID of the D-band having a peak at 1320 to 1450 $cm^{-1}$ appear. The present invention can also be applied to such a case.

From the above, the crystallinity of a carbon material can be evaluated by calculating the peak intensity ratio of the G-band to the D-band (hereinafter, referred to as $I_G/I_D$ ratio).

As obvious from the above, in the present invention, the crystallinity is increased to improve the sputtering characteristics and to reduce occurrence of particles during the sputtering, and the peak intensity ratio ($I_G/I_D$) of the G-band to the D-band in Raman scattering spectrometry is increased to 5.0 or more.

As a result, the problems that carbon is susceptible to form aggregates during sputtering can be solved; and also, detachment of carbon during sputtering or generation of a large number of particles on the film after sputtering can be inhibited.

The upper limit of the peak intensity ratio ($I_G/I_D$) of a G-band to a D-band is not particularly limited and is 20 or less in many cases. A peak intensity ratio ($I_G/I_D$) of 5.0 or more can effectively inhibit generation of particles. The peak intensity ratio of the present invention is the average of intensity ratios measured at arbitrary ten points of each target.

The sputtering target of the present invention is produced by a powder sintering method. Prior to the production, each raw material powder (for example, as a typical example, an Fe powder, a Pt powder, and a C powder) is prepared.

The Fe powder and the Pt powder desirably have an average particle diameter of 0.5 μm or more and 10 μm or less. A too small particle diameter facilitates oxidation to cause, for example, a problem of increasing the oxygen concentration in the sputtering target. Accordingly, the diameter is desirably 0.5 μm or more. In contrast, if these raw material powders have large particle diameters, fine dispersion of carbon particles in an alloy is difficult. Consequently, the particle diameter is further desirably 10 μm or less.

In the present invention, it is important that the C raw material powder having an average particle diameter of 0.5 to 50 μm is used. The usable type of the C powder is not particularly limited. The C powder is appropriately selected and used depending on the type of the target. Compared to unflaked graphite, flaked graphite has a higher electrical conductivity and hardly causes abnormal discharge, thus it is preferred.

The C powder having a too small particle diameter easily aggregates. Accordingly, the particle diameter is desirably 0.5 μm or more. In contrast, if the C powder has a large particle diameter it causes abnormal discharge during sputtering. Accordingly, the particle diameter is desirably 50 μm or less.

Furthermore, as a raw material powder, an alloy powder (an Fe—Pt powder, an Fe—Cu powder, a Pt—Cu powder, or an Fe—Pt—Cu powder) may be used. Though it varies depending on the composition, an alloy powder containing Pt is particularly effective for reducing the amount of oxygen in the raw material powder. In also a case of using an alloy powder, the powder desirably has an average particle diameter of 0.5 μm or more and 10 μm or less.

Subsequently, the above-mentioned powders are weighed to give a desired composition and are mixed and pulverized.

In order to uniformly disperse the carbon material in a matrix, it is important to remove lumps having a size of several hundred micrometers to several millimeters contained in the C raw material powder by cracking or filtration. The removal can be performed using, for example, a mixer, a rolling mixer, or a sieve of about 100 to 200 mesh. The sieve has a function of not only removing coarse particles but also cracking and mixing.

The cracking and sieving of a C raw material powder may be performed after mixing of the carbon raw material with other raw materials. The mixer that can be used is a vertical mixer, a V-type mixer, or a mixer having a performance equivalent to those of these mixers.

After removal of coarse lumps contained in a C raw material powder, the carbon material is mixed with other raw material powders. The powders can be mixed with an apparatus utilizing shear force. For example, a mortar, a high-speed agitation mixer, or a high-speed rolling mixer can be used. Another apparatus that can generate shear force but does not finely pulverize raw materials can also be used.

On the other hand, a mixer that finely pulverizes raw materials with impulsive force, such as a ball mill or a medium agitating mill, enhances fine pulverization of a carbon raw material to promote aggregation of the carbon raw material and is therefore unfavorable. However, such an apparatus may also be used for a significantly short period or under conditions suppressing the influence of fine pulverization.

The obtained powder mixture is molded and sintered by hot pressing. Instead of the hot pressing, plasma discharge sintering or hot hydrostatic pressure sintering may be employed. Though it varies depending on the composition of a sputtering target, the retention temperature for the sintering is in a range of 1000° C. to 1500° C. in many cases. The applied pressure is 25 to 35 MPa. Even under such sintering conditions, the prevention of aggregation of carbon particles is required.

Subsequently, the sintered compact taken out from the hot press mold is subjected to hot isostatic pressing. The hot isostatic pressing is effective for increasing the density of the sintered compact. Though it varies depending on the composition of the sintered compact, the retention temperature in the hot isostatic pressing is in a range of 1000° C. to 1500° C. in many cases. The applied pressure is 100 MPa or more.

The obtained sintered compact is processed into a desired shape with a lathe to give a sputtering target of the present invention.

As described above, a sputtering target for a magnetic recording film including carbon particles uniformly dispersed in an alloy at a high density and having a peak intensity ratio ($I_G/I_D$) of the G-band to the D-band in Raman scattering spectrometry being 5.0 or more can be produced. The obtained sputtering target of the present invention is useful as a sputtering target for forming a magnetic thin film having a granular structure.

EXAMPLES

The present invention will now be described by examples and comparative Examples. These examples are merely exemplary and are not intended to limit the scope of the invention. That is, the present invention is limited only by the claims and encompasses various modifications in addition to examples included in the present invention.

Example 1

As raw material powders, an Fe powder having an average particle diameter of 3 μm, a Pt powder having an average particle diameter of 3 μm, and a C powder having an average particle diameter of 15 μm were prepared and weighed to give a composition of 30Fe-30Pt-40C (mol %). As the C powder, flaked graphite having an average particle diameter of 15 μm was used.

Subsequently, the weighed C powder was loaded in a mixer and was pulverized at 800 rpm for 5 minutes. Then, the pulverized C powder, the Fe powder, and the Pt powder were put in a mortar and were mixed for 2 hours. Subsequently, the powder mixture was taken out from the mortar, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention.

After the retention, the resulting sintered compact was naturally cooled inside the chamber.

The sintered compact was taken out from the hot press mold and was then hot isostatic pressed under conditions: a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 1 shows a photograph of the structure of the resulting sintered compact. The photograph demonstrates the state in which carbon particles having a particle diameter similar to that of the charged raw material remained. The density of the sintered compact was measured by an Archimedes method, and the calculated relative density was 97.1%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 2:
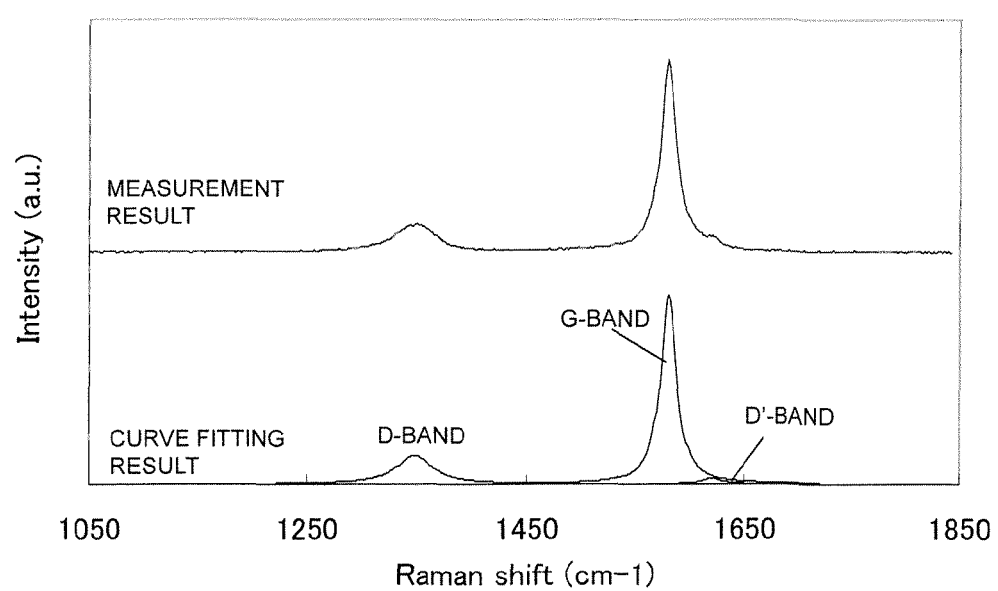
FIG. 2 shows the results of Raman scattering spectrometry and curve fitting in Example 1.

The curve fitting of the measurement results was performed using a Lorentz function. FIG. 2 shows the Raman scattering spectrum of Fe—Pt—C and the result of curve fitting thereof. The $I_G/I_D$ ratio was 7.05, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 64, which was significantly smaller than those in comparative examples.

TABLE 1

| | Composition | Carbon raw material | First step | Second step | Third step | Hot pressing temperature (° C.) | HIP temperature (° C.) | Relative density | $I_G/I_D$ | Number of particles |
|---|---|---|---|---|---|---|---|---|---|---|
| Example 1 | 30Fe-30Pt-40C (mol %) | Flaked graphite (average particle diameter: 15 μm) | — | Mixer (800 rpm, 5 min) | Mortar (2 hr) | 1400 | 1100 | 97.1% | 7.05 | 64 |
| Example 2 | 30Fe-30Pt-40C (mol %) | Flaked graphite (average particle diameter: 15 μm) | — | Mixer (800 rpm, 5 min) | 5-L medium agitating mill (300 rpm, 1 hr) | 1400 | 1100 | 97.0% | 5.02 | 153 |
| Example 3 | 30Fe-30Pt-40C (mol %) | Graphite (average particle diameter: 0.5 μm) | — | Mixer (800 rpm, 5 min) | 5-L medium agitating mill (300 rpm, 30 min) | 1400 | 1100 | 96.5% | 5.93 | 116 |
| Example 4 | 30Fe-30Pt-40C (mol %) | Graphite (average particle diameter: 20 μm) | — | Sieve (100 mesh) | Mixer (high-speed) (1300 rpm, 5 min) | 1400 | 1100 | 96.6% | 6.52 | 121 |
| Example 5 | 35Fe-25Pt-35C-5Ag (mol %) | Graphite (average particle diameter: 20 μm) | Vertical mixer | Sieve (200 mesh) | Mortar (2 hr) | 950 | 950 | 97.0% | 5.84 | 28 |
| Example 6 | 25Fe-25Pt-50C (mol %) | Flaked graphite (average particle diameter: 15 μm) | V-type mixer | Mixer (800 rpm, 5 min) | Mortar (2 hr) | 1400 | 1100 | 96.1% | 6.93 | 102 |
| Example 7 | 45Fe-45Pt-10C (mol %) | Flaked graphite (average particle diameter: 15 μm) | V-type mixer | Mixer (800 rpm, 5 min) | Mortar (2 hr) | 1300 | 1100 | 97.6% | 6.85 | 24 |
| Example 8 | 39Fe-40Pt-2Ru-10C-3TiO$_2$-3SiO$_2$-3Cr$_2$O$_3$ (mol %) | Graphite (average particle diameter: 20 μm) | Vertical mixer | Mixer (800 rpm, 5 min) | Mortar (2 hr) | 1100 | 1100 | 99.1% | 6.27 | 13 |
| Example 9 | 30Fe-60Pt-10C (mol %) | Flaked graphite (average particle diameter: 15 μm) | — | Sieve (100 mesh) | Mortar (2 hr) | 1300 | 1100 | 97.9% | 7.02 | 23 |
| Example 10 | 55Fe-5Pt-40C (mol %) | Flaked graphite (average particle diameter: 6 μm) | — | Sieve (100 mesh) | Mortar (2 hr) | 1400 | 1100 | 96.7% | 6.94 | 97 |
| Example 11 | 30Fe-45Pt-20C-5Au (mol %) | Flaked graphite (average particle diameter: 15 μm) | Vertical mixer | Mixer (800 rpm, 5 min) | Mixer (high-speed) (1300 rpm, 5 min) | 1350 | 1100 | 96.8% | 6.69 | 56 |
| Example 12 | 35Fe-35Pt-20C-10Cu (mol %) | Flaked graphite (average particle diameter: 15 μm) | Vertical mixer | Mixer (800 rpm, 5 min) | Mixer (high-speed) (1300 rpm, 5 min) | 1350 | 1100 | 97.2% | 6.92 | 42 |
| Example 13 | 43Fe-45Pt-2B-10C (mol %) | Flaked graphite (average particle diameter: 5 μm) | Vertical mixer | Mixer (800 rpm, 5 min) | Mixer (high-speed) (1300 rpm, 5 min) | 1200 | 1100 | 97.1% | 6.88 | 72 |
| Example 14 | 40Fe-40Pt-10C-3Ta$_2$O$_5$-3B$_2$O$_3$-3MgO-1CoO (mol %) | Flaked graphite (average particle diameter: 15 μm) | Vertical mixer | Mixer (800 rpm, 5 min) | Mortar (2 hr) | 1100 | 1100 | 98.2% | 6.29 | 24 |

TABLE 1-continued

|  | Composition | Carbon raw material | First step | Second step | Third step | Hot pressing temperature (° C.) | HIP temperature (° C.) | Relative density | $I_G/I_D$ | Number of particles |
|---|---|---|---|---|---|---|---|---|---|---|
| Comparative Example 1 | 30Fe-30Pt-40C (mol %) | Graphite (average particle diameter: 20 μm) | Vertical mixer | Sieve (200 mesh) | 5-L medium agitating mill (300 rpm, 20 hr) | 1400 | 1100 | 96.7% | 2.05 | 35000 |
| Comparative Example 2 | 30Fe-30Pt-40C (mol %) | Graphite (average particle diameter: 20 μm) | Vertical mixer | Sieve (100 mesh) | 5-L medium agitating mill (300 rpm, 48 hr) | 1400 | 1100 | 96.8% | 1.70 | 90000 |

Example 2

As raw material powders, an Fe powder having an average particle diameter of 3 μm, a Pt powder having an average particle diameter of 3 μm, and a C powder having an average particle diameter of 15 μm were prepared and weighed to give a composition of 30Fe-30Pt-40C (mol %). As the C powder, flaked graphite having an average particle diameter of 15 μm was used.

Subsequently, the weighed C powder was loaded in a mixer and was pulverized at 800 rpm for 5 minutes. Then, the pulverized C powder, the Fe powder, and the Pt powder were put in a 5-L medium agitating mill and were mixed at 300 rpm for 1 hour. Subsequently, the powder mixture was taken out from the agitating mill, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

Figure 3:
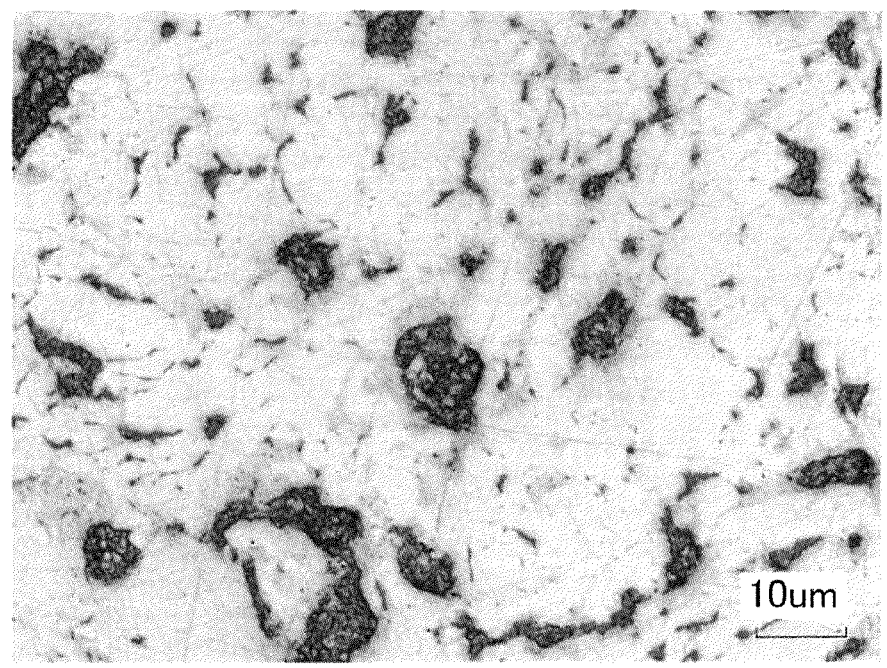
FIG. 3 is a structural image of the sintered compact of Example 2 observed with a laser microscope.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 3 shows a photograph of the structure of the resulting sintered compact. The photograph demonstrates the state in which carbon particles having a particle diameter similar to that of the charged raw material remained. The density of the sintered compact was measured by an Archimedes method, and the calculated relative density was 97.0%.

Figure 4:
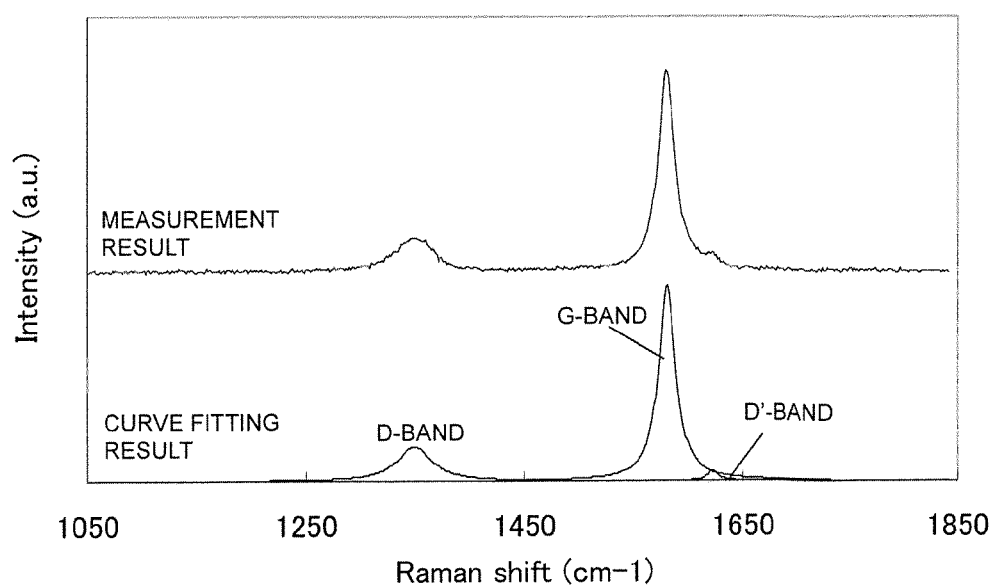
FIG. 4 shows the results of Raman scattering spectrometry and curve fitting in Example 2.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm. The curve fitting of the measurement results was performed using a Lorentz function. FIG. 4 shows the Raman scattering spectrum of Fe—Pt—C and the result of curve fitting thereof. The $I_G/I_D$ ratio was 5.02, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 153, which was significantly smaller than those in comparative examples.

Example 3

As raw material powders, an Fe powder having an average particle diameter of 3 μm, a Pt powder having an average particle diameter of 3 μm, and a C powder having an average particle diameter of 0.5 μm were prepared and weighed to give a composition of 30Fe-30Pt-40C (mol %). As the C powder, graphite having an average particle diameter of 0.5 μm was used.

Subsequently, the weighed C powder was loaded in a mixer and was pulverized at 800 rpm for 5 minutes. Then, the pulverized C powder, the Fe powder, and the Pt powder were put in a 5-L medium agitating mill and were mixed at 300 rpm for 30 minutes. Subsequently, the powder mixture was taken out from the agitating mill, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

Figure 5:
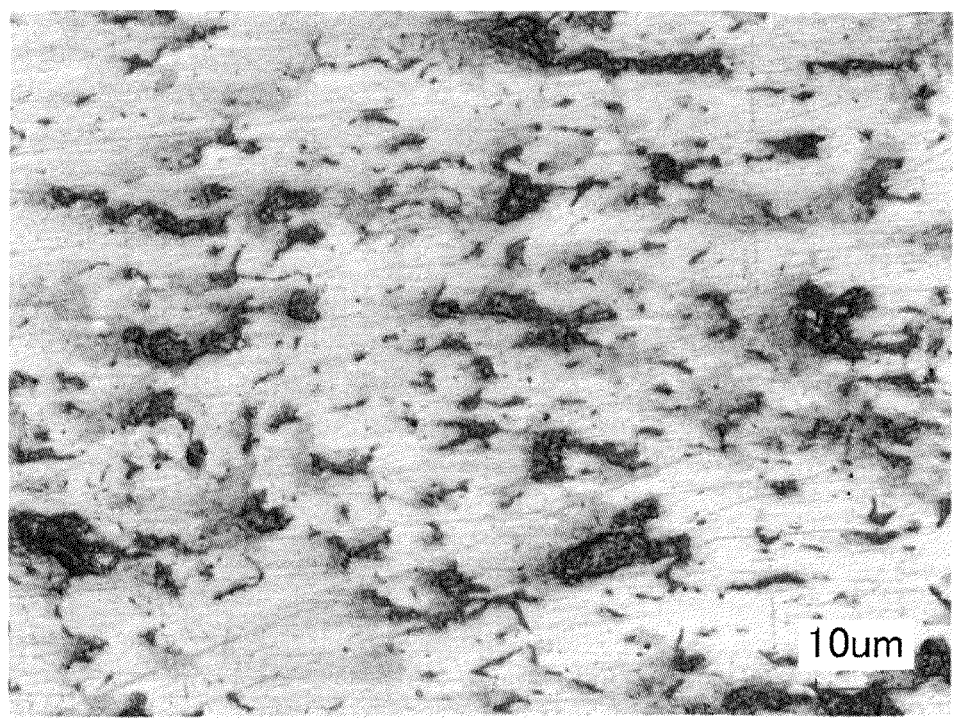
FIG. 5 is a structural image of the sintered compact of Example 3 observed with a laser microscope.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 5 shows a photograph of the structure of the resulting sintered compact. The photograph demonstrates the state in which carbon particles having a particle diameter similar to that of the charged raw material remained. The density of the sintered compact was measured by an Archimedes method, and the calculated relative density was 96.5%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 6:
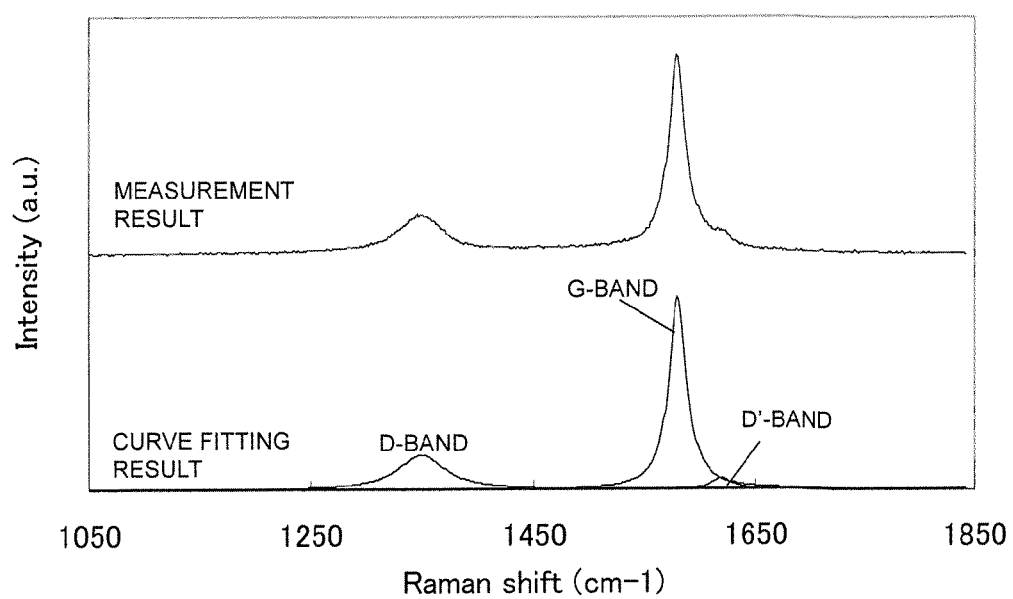
FIG. 6 shows the results of Raman scattering spectrometry and curve fitting in Example 3.

The curve fitting of the measurement results was performed using a Lorentz function. FIG. 6 shows the Raman scattering spectrum of Fe—Pt—C and the result of curve fitting thereof. The $I_G/I_D$ ratio was 5.93, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 116, which was significantly smaller than those in comparative examples.

Example 4

As raw material powders, an Fe powder having an average particle diameter of 3 μm, a Pt powder having an average particle diameter of 3 μm, and a C powder having an average particle diameter of 20 μm were prepared and weighed to give a composition of 30Fe-30Pt-40C (mol %). As the C powder, graphite having an average particle diameter of 20 μm was used.

Subsequently, the weighed raw material powders were sieved through a 100 mesh sieve and were then mixed with a high-speed agitation mixer at 1300 rpm for 5 minutes. And the powder mixture was taken out from the mixer, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

Figure 7:
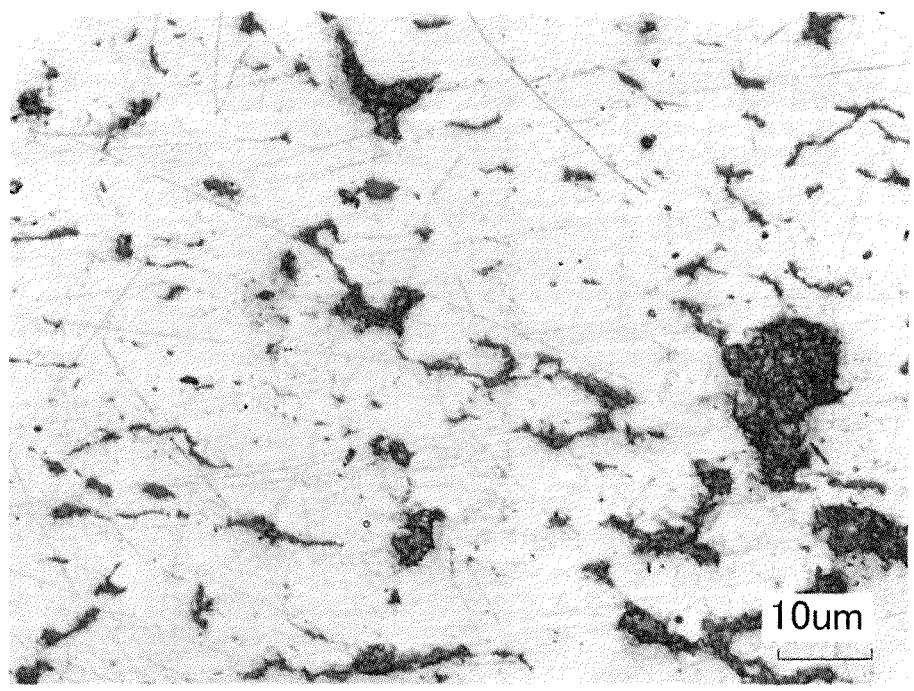
FIG. 7 is a structural image of the sintered compact of Example 4 observed with a laser microscope.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 7 shows a photograph of the structure of the resulting sintered compact. The photograph demonstrates the state in which carbon particles having a particle diameter similar to that of the charged raw material remained. The density of the sintered compact was measured by an Archimedes method, and the calculated relative density was 96.6%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 8:
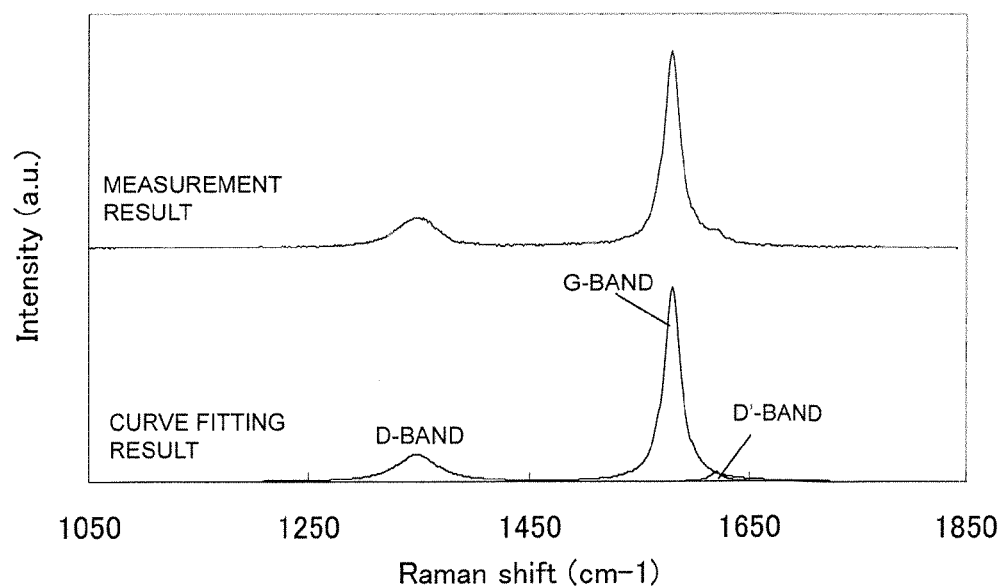
FIG. 8 shows the results of Raman scattering spectrometry and curve fitting in Example 4.

The curve fitting of the measurement results was performed using a Lorentz function. FIG. 8 shows the Raman scattering spectrum of Fe—Pt—C and the result of curve fitting thereof. The $I_G/I_D$ ratio was 6.52, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 121, which was significantly smaller than those in comparative examples.

Example 5

As raw material powders, an Fe powder having an average particle diameter of 3 μm, a Pt powder having an average particle diameter of 3 μm, a Ag powder having an average particle diameter of 3 μm, and a C powder having an average particle diameter of 20 μm were prepared and weighed to give a composition of 35Fe-25Pt-35C-5Ag (mol %). As the C powder, graphite having an average particle diameter of 20 μm was used.

The weighed raw material powders were loaded in a vertical mixer and were mixed. The powder mixture was sieved through a 200 mesh sieve and was then mixed in a mortar for 2 hours.

Subsequently, the powder mixture was taken out from the mortar, charged in a carbon mold, and hot pressed under conditions of a vacuum atmosphere, a rate of temperature increase of 300° C./hour, a retention temperature of 950° C., a retention time of 2 hours, and a pressure of 30 MPa from the start of the increase in temperature until the end of the retention. After the retention, the resulting sintered compact was naturally cooled inside the chamber.

Figure 9:
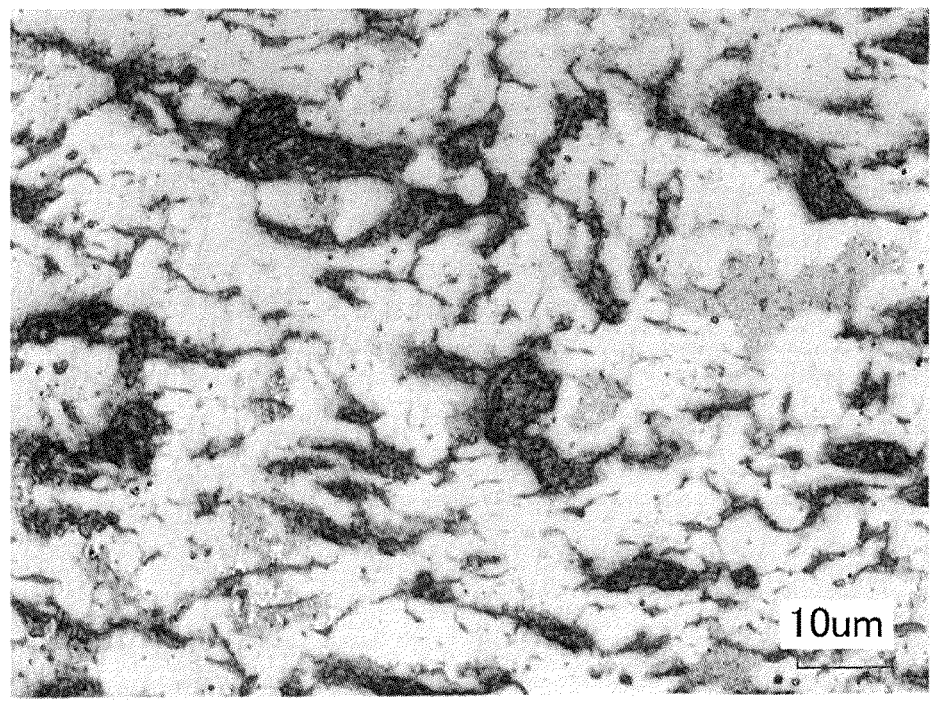
FIG. 9 is a structural image of the sintered compact of Example 5 observed with a laser microscope.

The sintered compact was taken out from the hot press mold and was then hot isostatic pressed under conditions of a rate of temperature increase of 300° C./hour, a retention temperature of 950° C., a retention time of 2 hours, and gradually increasing the Ar gas pressure from the start of the increase in temperature and maintaining the Ar gas pressure at 150 MPa during the retention at 950° C. After the retention, the sintered compact was naturally cooled inside the furnace. FIG. 9 shows a photograph of the structure of the resulting sintered compact. The photograph demonstrates the state in which carbon particles having a particle diameter similar to that of the charged raw material remained. The density of the sintered compact was measured by an Archimedes method, and the calculated relative density was 97.0%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 10:
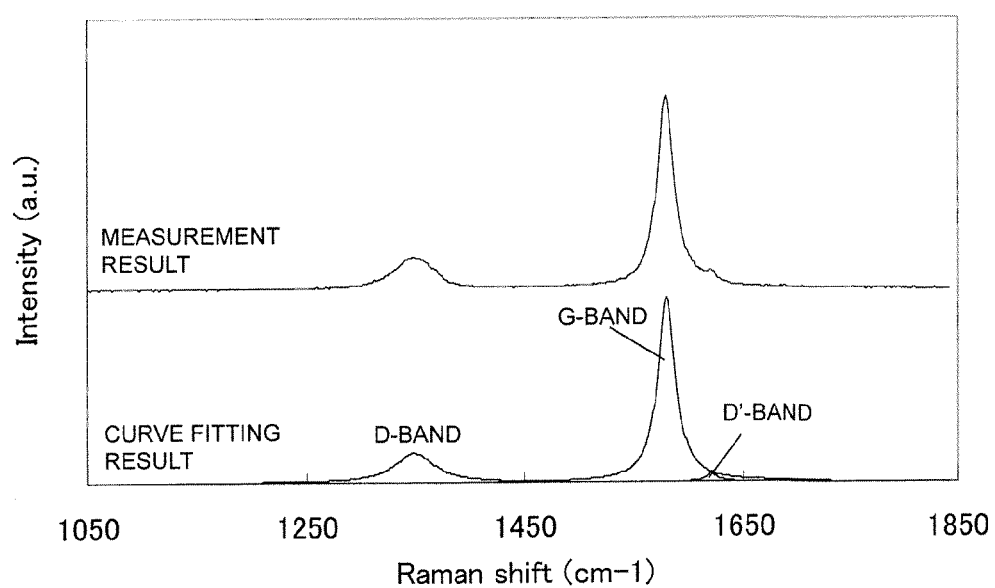
FIG. 10 shows the results of Raman scattering spectrometry and curve fitting in Example 5.

The curve fitting of the measurement results was performed using a Lorentz function. FIG. 10 shows the Raman scattering spectrum of Fe—Pt—C and the result of curve fitting thereof. The $I_G/I_D$ ratio was 5.84, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered. Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 28, which was significantly smaller than those in comparative examples.

Example 6

As raw material powders, an Fe powder having an average particle diameter of 3 μm, a Pt powder having an average particle diameter of 3 μm, and a C powder having an average particle diameter of 15 μm were prepared and weighed to give a composition of 25Fe-25Pt-50C (mol %). As the C powder, flaked graphite having an average particle diameter of 15 μm was used.

The weighed raw material powders were loaded in a V-type mixer and were mixed. The powder mixture was pulverized with a mixer at 800 rpm for 5 minutes and was then mixed in a mortar for 2 hours.

Subsequently, the powder mixture was taken out from the mortar, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 96.1%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.93, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 102, which was significantly smaller than those in comparative examples.

Example 7

As raw material powders, an Fe powder having an average particle diameter of 3 μm, a Pt powder having an average particle diameter of 3 μm, and a C powder having an average particle diameter of 15 μm were prepared and weighed to give a composition of 45Fe-45Pt-10C (mol %). As the C powder, flaked graphite having an average particle diameter of 15 μm was used.

The weighed raw material powders were loaded in a V-type mixer and were mixed. The powder mixture was pulverized with a mixer at 800 rpm for 5 minutes and was then mixed in a mortar for 2 hours.

Subsequently, the powder mixture was taken out from the mortar, charged in a carbon mold, and hot pressed under conditions of a vacuum atmosphere, a rate of temperature increase of 300° C./hour, a retention temperature of 1300° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 97.6%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.85, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 24, which was significantly smaller than those in comparative examples.

Example 8

As raw material powders, an Fe powder having an average particle diameter of 3 μm, a Pt powder having an average particle diameter of 3 μm, a Ru powder having an average particle diameter of 3 μm, a C powder having an average particle diameter of 20 μm, a $TiO_2$ powder having an average particle diameter of 1 μm, a $SiO_2$ powder having an average particle diameter of 0.5 μm, and a $Cr_2O_3$ powder having an average particle diameter of 0.5 μm were prepared and weighed to give a composition of 39Fe-40Pt-2Ru-10C-3$TiO_2$-3$SiO_2$-3$Cr_2O_3$ (mol %). As the C powder, graphite having an average particle diameter of 20 μm was used.

The weighed raw material powders were loaded in a vertical mixer and were mixed. Subsequently, the powder mixture was pulverized with a mixer at 800 rpm for 5 minutes and was then mixed in a mortar for 2 hours.

Subsequently, the powder mixture was taken out from the mortar, charged in a carbon mold, and hot pressed under conditions of a vacuum atmosphere, a rate of temperature increase of 300° C./hour, a retention temperature of 1100° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 99.1%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.27, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 µm adhered onto the substrate was counted with a surface defect inspection system (Surfscan 6420, produced by KLA-Tencor Corporation). As shown in Table 1, the number of particles was 13, which was significantly smaller than those in comparative examples.

Example 9

As raw material powders, an Fe powder having an average particle diameter of 3 µm, a Pt powder having an average particle diameter of 3 µm, and a C powder having an average particle diameter of 15 µm were prepared and weighed to give a composition of 30Fe-60Pt-10C (mol %). As the C powder, flaked graphite having an average particle diameter of 15 µm was used.

Subsequently, the weighed raw material powders were sieved through a 100 mesh sieve and were then put in a mortar and mixed for 2 hours.

Subsequently, the powder mixture was taken out from the mortar, charged in a carbon mold, and hot pressed under conditions of a vacuum atmosphere, a rate of temperature increase of 300° C./hour, a retention temperature of 1300° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 97.9%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 7.02, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 µm adhered onto the substrate was counted with a surface defect inspection system (Surfscan 6420, produced by KLA-Tencor Corporation). As shown in Table 1, the number of particles was 23, which was significantly smaller than those in comparative examples.

Example 10

As raw material powders, an Fe powder having an average particle diameter of 3 µm, a Pt powder having an average particle diameter of 3 µm, and a C powder having an average particle diameter of 15 µm were prepared and weighed to give a composition of 55Fe-5Pt-40C (mol %). As the C powder, flaked graphite having an average particle diameter of 6 µm was used.

Subsequently, the weighed raw material powders were sieved through a 100 mesh sieve and were then put in a mortar and mixed for 2 hours.

Subsequently, the powder mixture was taken out from the mortar, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 96.7%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.94, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 97, which was significantly smaller than those in comparative examples.

Example 11

As raw material powders, an Fe powder having an average particle diameter of 3 μm, a Pt powder having an average particle diameter of 3 μm, a C powder having an average particle diameter of 15 μm, and a Au powder having an average particle diameter of 5 μm were prepared and weighed to give a composition of 30Fe-45Pt-20C-5Au (mol %). As the C powder, flaked graphite having an average particle diameter of 15 μm was used.

The weighed raw material powders were loaded in a vertical mixer and were mixed. Subsequently, the powder mixture was pulverized with a mixer at 800 rpm for 5 minutes and was then mixed with a high-speed agitation mixer at 1300 rpm for 5 minutes.

And the powder mixture was taken out from the mixer, charged in a carbon mold, and hot pressed under conditions of a vacuum atmosphere, a rate of temperature increase of 300° C./hour, a retention temperature of 1350° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the sintered compact was measured by an Archimedes method, and the calculated relative density was 96.8%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.69, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 56, which was significantly smaller than those in comparative examples.

Example 12

As raw material powders, an Fe powder having an average particle diameter of 3 μm, a Pt powder having an average particle diameter of 3 μm, a C powder having an average particle diameter of 15 μm, and a Cu powder having an average particle diameter of 5 μm were prepared and weighed to give a composition of 35Fe-35Pt-20C-10Cu (mol %). As the C powder, flaked graphite having an average particle diameter of 15 μm was used.

The weighed raw material powders were loaded in a vertical mixer and were mixed. Subsequently, the powder mixture was pulverized with a mixer at 800 rpm for 5 minutes and was then mixed with a high-speed agitation mixer at 1300 rpm for 5 minutes.

And the powder mixture was taken out from the mixer, charged in a carbon mold, and hot pressed under conditions of a vacuum atmosphere, a rate of temperature increase of 300° C./hour, a retention temperature of 1350° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 97.2%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.92, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 42, which was significantly smaller than those in comparative examples.

Example 13

As raw material powders, an Fe powder having an average particle diameter of 3 μm, a Pt powder having an average particle diameter of 3 μm, a C powder having an average particle diameter of 15 μm, and a B powder having an average particle diameter of 10 μm were prepared and weighed to give a composition of 43Fe-45Pt-2B-10C (mol %). As the C powder, flaked graphite having an average particle diameter of 15 μm was used.

The weighed raw material powders were loaded in a vertical mixer and were mixed. Subsequently, the powder mixture was pulverized with a mixer at 800 rpm for 5 minutes and was then mixed with a high-speed agitation mixer at 1300 rpm for 5 minutes.

And the powder mixture was taken out from the mixer, charged in a carbon mold, and hot pressed under conditions of a vacuum atmosphere, a rate of temperature increase of 300° C./hour, a retention temperature of 1200° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 97.1%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.88, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 72, which was significantly smaller than those in comparative examples.

Example 14

As raw material powders, an Fe powder having an average particle diameter of 3 μm, a Pt powder having an average particle diameter of 3 μm, a C powder having an average particle diameter of 15 μm, a $Ta_2O_5$ powder having an average particle diameter of 1 μm, a $B_2O_3$ powder having an average particle diameter of 1 μm, a MgO powder having an average particle diameter of 1 μm, and a CoO powder having an average particle diameter of 1 μm were prepared and weighed to give a composition of 40Fe-40Pt-10C-3$Ta_2O_5$-3$B_2O_3$-3MgO-1CoO (mol %). As the C powder, flaked graphite having an average particle diameter of 15 μm was used.

The weighed raw material powders were loaded in a vertical mixer and were mixed. Subsequently, the powder mixture was pulverized with a mixer at 800 rpm for 5 minutes and was then mixed with a mortar for 2 hours.

And the powder mixture was taken out from the mixer, charged in a carbon mold, and hot pressed under conditions of a vacuum atmosphere, a rate of temperature increase of 300° C./hour, a retention temperature of 1100° C., a retention time of 2 hours, and a pressure of 30 MPa from the start of the increase in temperature until the end of the retention. After the retention, the resulting sintered compact was naturally cooled inside the chamber.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. The density of the resulting sintered compact was measured by an Archimedes method, and the calculated relative density was 98.2%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

The curve fitting of the measurement results was performed using a Lorentz function. As a result, the $I_G/I_D$ ratio was 6.29, which satisfied the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 24, which was significantly smaller than those in comparative examples.

Comparative Example 1

As raw material powders, an Fe powder having an average particle diameter of 3 μm, a Pt powder having an average particle diameter of 3 μm, and a C powder having an average particle diameter of 20 μm were prepared and weighed to give a composition of 30Fe-30Pt-40C (mol %). As the C powder, graphite having an average particle diameter of 20 μm was used.

The weighed raw material powders were loaded in a vertical mixer and were mixed. Subsequently, the powder mixture was sieved through a 200 mesh sieve and was then mixed with a 5-L medium agitation mill at 300 rpm for 20 hours.

Subsequently, the powder mixture was taken out from the agitating mill, charged in a carbon mold, and hot pressed under conditions of a vacuum atmosphere, a rate of temperature increase of 300° C./hour, a retention temperature of 1400° C., a retention time of 2 hours, and a pressure of 30 MPa from the start of the increase in temperature until the end of the retention. After the retention, the resulting sintered compact was naturally cooled inside the chamber.

Figure 11:
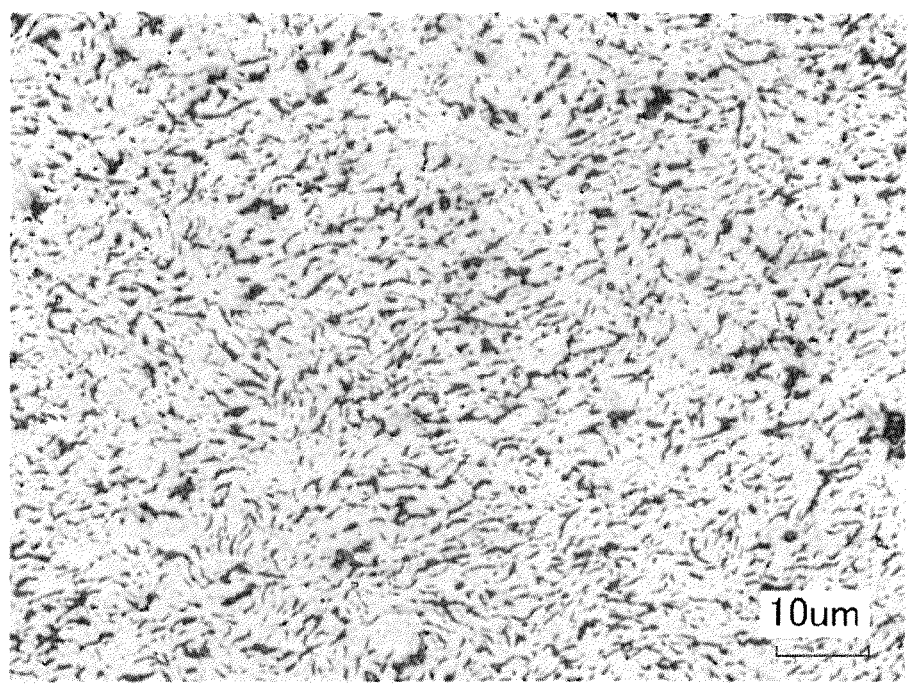
FIG. 11 is a structural image of the sintered compact of Comparative Example 1 observed with a laser microscope.

The sintered compact was taken out from the hot press mold and was then hot isostatic pressed under conditions of a rate of temperature increase of 300° C./hour, a retention temperature of 1100° C., a retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 11 shows a photograph of the structure of the resulting sintered compact. The photograph demonstrates the state in which the carbon particles charged as a raw material were finely pulverized. The density of the sintered compact was measured by an Archimedes method, and the calculated relative density was 96.7%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 12:
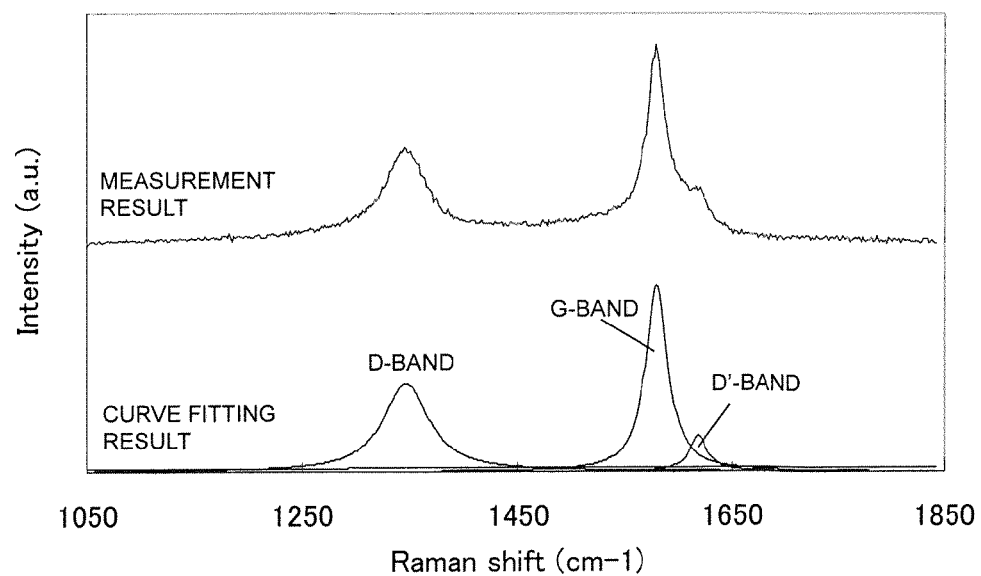
FIG. 12 shows the results of Raman scattering spectrometry and curve fitting in Comparative Example 1.

The curve fitting of the measurement results was performed using a Lorentz function. FIG. 12 shows the Raman scattering spectrum of Fe—Pt—C and the result of curve fitting thereof. The $I_G/I_D$ ratio was 2.05, which did not satisfy the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 35000, which was very large.

Comparative Example 2

As raw material powders, an Fe powder having an average particle diameter of 3 μm, a Pt powder having an average particle diameter of 3 μm, and a C powder having an average particle diameter of 20 μm were prepared and weighed to give a composition of 30Fe-30Pt-40C (mol %). As the C powder, graphite having an average particle diameter of 20 μm was used.

The weighed raw material powders were loaded in a vertical mixer and were mixed. Subsequently, the powder mixture was sieved through a 100 mesh sieve and was then mixed with a 5-L medium agitation mill at 300 rpm for 48 hours.

Subsequently, the powder mixture was taken out from the agitating mill, charged in a carbon mold, and hot pressed under conditions of a vacuum atmosphere, a rate of temperature increase of 300° C./hour, a retention temperature at 1400° C., a retention time of 2 hours, and a pressure of 30 MPa from the start of the increase in temperature until the end of the retention. After the retention, the resulting sintered compact was naturally cooled inside the chamber.

Figure 13:
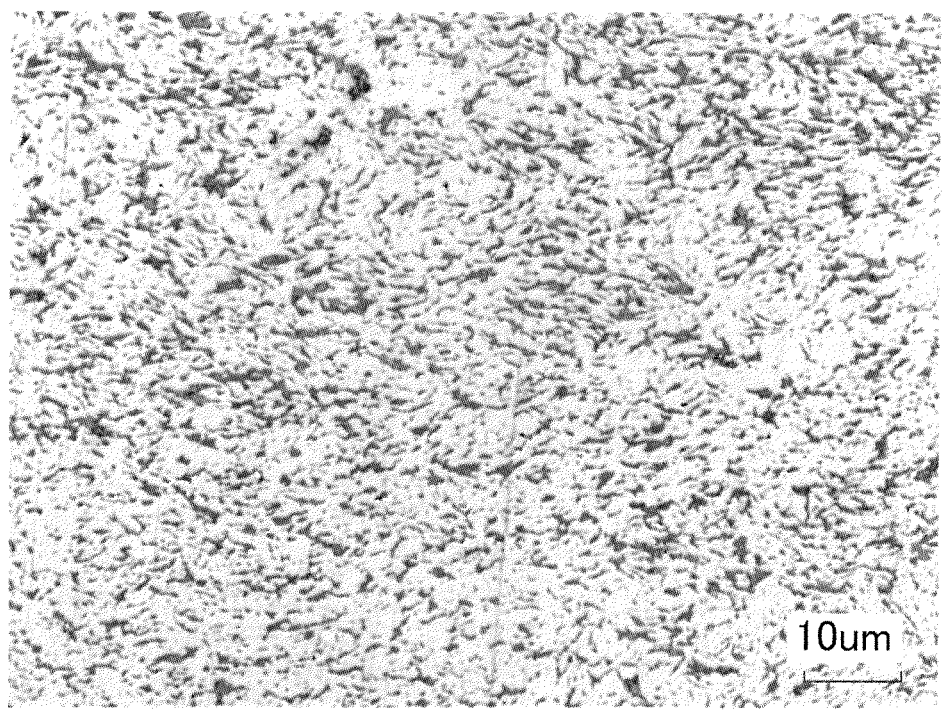
FIG. 13 is a structural image of the sintered compact of Comparative Example 2 observed with a laser microscope.

The sintered compact was taken out from the hot press mold and was then hot isostatic pressed under conditions of a rate of temperature increase of 300° C./hour, a retention temperature at 1100° C., retention time of 2 hours, and gradually increasing the Ar gas pressure from the start of the increase in temperature and maintaining the Ar gas pressure at 150 MPa during the retention at 1100° C. After the retention, the sintered compact was naturally cooled inside the furnace. FIG. 13 shows a photograph of the structure of the resulting sintered compact. The photograph demonstrates the state in which the carbon particles charged as a raw material were finely pulverized. The density of the sintered compact was measured by an Archimedes method, and the calculated relative density was 96.8%.

The sintered compact was cut with a lathe to give a target having a diameter of 180.0 mm and a thickness of 5.0 mm. The conditions for Raman scattering spectrometric measurement of the target were an excitation wavelength of 532 nm, an output of 5 mW, and a diffraction grating of 1800 L/mm.

Figure 14:
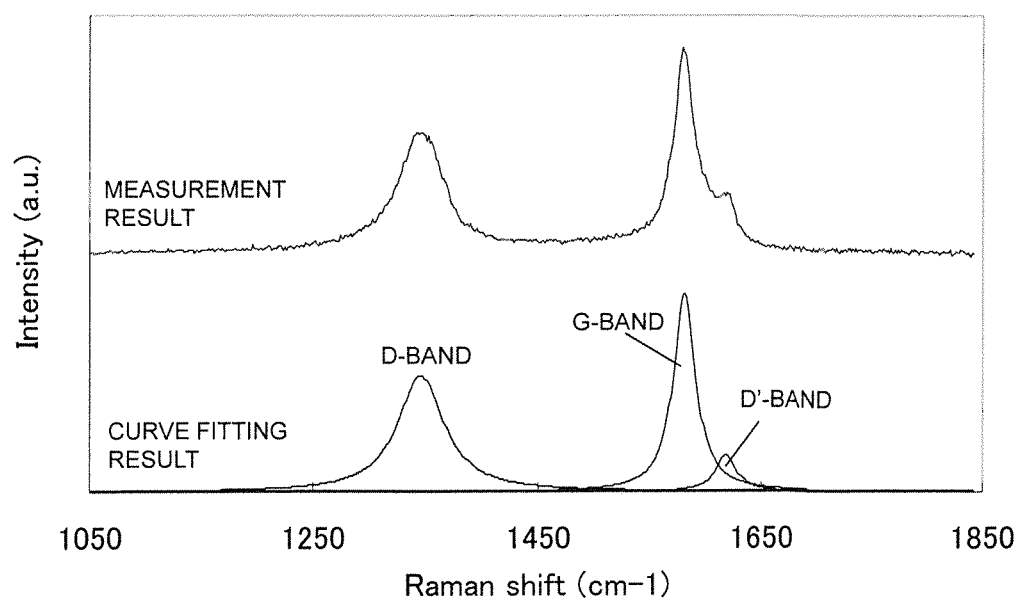
FIG. 14 shows the results of Raman scattering spectrometry and curve fitting in Comparative Example 2.

The curve fitting of the measurement results was performed using a Lorentz function. FIG. 14 shows the Raman scattering spectrum of Fe—Pt—C and the result of curve fitting thereof. The $I_G/I_D$ ratio was 1.70, which did not satisfy the requirement, an $I_G/I_D$ ratio of 5.0 or more, of the present invention.

The target was set in a magnetron sputtering apparatus (C-3010 sputtering system, produced by Canon ANELVA Corporation) and was sputtered.

Under sputtering conditions of an applied power of 1 kW and an Ar gas pressure of 1.7 Pa, after presputtering at 2 kWhr, a film was formed on a silicon substrate having a diameter of 4 inches for 20 seconds. The number of particles having a particle diameter of 0.25 to 3 μm adhered onto the substrate was counted with a surface defect inspection system (Surfscan 6420, produced by KLA-Tencor Corporation). As shown in Table 1, the number of particles was 90000, which was very large.

The sputtering target for a magnetic recording film of the present invention allows production of a magnetic thin film having a granular structure without using an expensive co-sputtering apparatus. The invention can provide a sputtering target, in particular, an Fe—Pt-based sputtering target, for a magnetic recording film, where carbon particles are dispersed in the target. The sputtering target has an excellent effect of solving the problems that carbon is a material which is not susceptible to being sintered and is susceptible to form aggregates and that detachment of carbon lumps occurs during sputtering to result in generation of a large number of particles on the film. Accordingly, the sputtering target is useful for forming a magnetic thin film having a granular structure.

The invention claimed is:

1. A sputtering target having a sintered body for a magnetic recording film comprising:
   a metal matrix having a composition comprising Pt in an amount of 5 mol % or more and 60 mol % or less and a balance of Fe; and
   carbon particles in a form of flaked graphite dispersed in the metal matrix in an amount of 10 mol % or more and 70 mol % or less, and having a peak intensity ratio ($I_G/I_D$) of 5.0 or more for a peak intensity of the G-band, $I_G$, and a peak intensity of the D-band, $I_D$, in Raman scattering spectrometry,
   wherein the sputtering target further comprises 0.5 mol % or more and 20 mol % or less of particles of at least one oxide additive selected from the group consisting of $SiO_2$, $Cr_2O_3$, $CoO$, $Ta_2O_5$, $B_2O_3$, $MgO$, and $Co_3O_4$.

2. The sputtering target for a magnetic recording film according to claim 1, wherein the sputtering target has a relative density of 90% or more.

3. The sputtering target for a magnetic recording film according to claim 2, wherein the sputtering target further comprises 0.5 mol % or more and 20 mol % or less of at least one additional element selected from the group consisting of B, Ru, Ag, Au, and Cu.

4. The sputtering target for a magnetic recording film according to claim 1, wherein the sputtering target further comprises 0.5 mol % or more and 20 mol % or less of at least one additional element selected from the group consisting of B, Ru, Ag, Au, and Cu.

5. The sputtering target for a magnetic recording film according to claim 1, wherein said peak intensity ratio ($I_G/I_D$) of the peak intensity of the G-band, $I_G$, and the peak intensity of the D-band, $I_D$, in Raman scattering spectrometry is 5.02 or more.

6. A sputtering target for producing a magnetic recording film, comprising a sintered body comprising a metal matrix and carbon particles in a form of flaked graphite dispersed in said metal matrix and having a peak intensity ratio ($I_G/I_D$) for a peak intensity of the G-band, $I_G$, and a peak intensity of the D-band, $I_D$, of 5.0 or more in Raman scattering spectrometry, said metal matrix consisting of Fe and 5 mol % or more and 60 mol % or less of Pt, and a content of said carbon particles in said sintered body being 10 mol % or more and 70 mol %, wherein the sputtering target further comprises 0.5 mol % or more and 20 mol % or less of particles of at least one oxide additive selected from the group consisting of $SiO_2$, $Cr_2O_3$, CoO, $Ta_2O_5$, $B_2O_3$, MgO, and $Co_3O_4$.

7. The sputtering target according to claim 6, wherein said sintered body has a relative density of 95% or more.

8. A sputtering target for producing a magnetic recording film, comprising a sintered body comprising a metal matrix and carbon particles in a form of flaked graphite dispersed in said metal matrix and having a peak intensity ratio ($I_G/I_D$) for a peak intensity of the G-band, $I_G$, and a peak intensity of the D-band, $I_D$, of 5.0 or more in Raman scattering spectrometry, said metal matrix consisting of Fe, 5 mol % or more and 60 mol % or less of Pt, and 0.5 mol % or more and 20 mol % or less of at least one additional element selected from the group consisting of B, Ru, Au, and Cu, and a content of said carbon particles in said sintered body being 10 mol % or more and 70 mol %, wherein the sputtering target further comprises 0.5 mol % or more and 20 mol % or less of particles of at least one oxide additive selected from the group consisting of $SiO_2$, $Cr_2O_3$, CoO, $Ta_2O_5$, $B_2O_3$, MgO, and $Co_3O_4$.

9. The sputtering target according to claim 8, wherein said sintered body has a relative density of 95% or more.

* * * * *